(12) United States Patent
Cama et al.

(10) Patent No.: US 6,433,825 B1
(45) Date of Patent: *Aug. 13, 2002

(54) EMI-PROTECTED EJECT INTERFACE FOR AN ELECTRONIC DEVICE

(75) Inventors: David M. Cama, Macedon; Anthony G. Chinnici, Rochester, both of NY (US)

(73) Assignee: Eastman Kodak Company, Rochester, NY (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/992,890

(22) Filed: Dec. 18, 1997

(51) Int. Cl.⁷ .......................... H04N 5/225; H05K 9/00
(52) U.S. Cl. .................. 348/373; 348/374; 361/818
(58) Field of Search ................. 348/373, 374, 348/375, 223; 361/816, 818, 800

(56) References Cited

U.S. PATENT DOCUMENTS

| | | | |
|---|---|---|---|
| 3,721,746 A | 3/1973 | Knappenberger | 174/35 MS |
| 4,152,671 A | 5/1979 | Tuma et al. | 331/68 |
| 4,218,578 A | 8/1980 | Olschewski et al. | 174/35 R |
| 4,689,723 A | 8/1987 | Myers et al. | 361/424 |
| 5,005,106 A | 4/1991 | Kiku | 361/424 |
| 5,006,667 A | 4/1991 | Lonka | 174/35 R |
| 5,333,100 A * | 7/1994 | Anhalt et al. | 361/818 |
| 5,550,587 A * | 8/1996 | Miyadera | 348/223 |
| 5,657,081 A * | 8/1997 | Kurahashi | 348/375 |
| 5,726,864 A * | 3/1998 | Copeland et al. | 361/800 |
| 5,774,337 A * | 6/1998 | Lee et al. | 361/725 |
| 5,907,354 A * | 5/1999 | Cama et al. | 348/373 |
| 6,031,732 A * | 2/2000 | Koike et al. | 361/816 |

* cited by examiner

Primary Examiner—Wendy R. Garber
Assistant Examiner—Luong Nguyen
(74) Attorney, Agent, or Firm—David M. Woods

(57) ABSTRACT

An eject interface for a removable peripheral used in an electronic device such as an electronic camera includes an eject mechanism for removably receiving the peripheral, a shield for enclosing at least part of the eject mechanism in order to isolate the peripheral from EMI generated by the camera, and a grounding connection on the shield for grounding the shield to a circuit ground on the camera.

20 Claims, 5 Drawing Sheets

EMI-PROTECTED EJECT INTERFACE FOR AN ELECTRONIC DEVICE

FIELD OF THE INVENTION

The invention pertains to the protection of components used in an electronic device from electromagnetic interference (EMI), and especially to EMI protection of an interface between a camera and a removable peripheral device, such as a hard drive memory card.

BACKGROUND OF THE INVENTION

It is highly desirable to provide EMI shielding for a removable peripheral, such as a memory device, in order to suppress the passage of signals into the peripheral that might be picked up by circuitry in the peripheral, and to suppress the radiation of signals by the peripheral or by electronics within the electronic device utilizing the peripheral. The trend in the development of electronic devices, such as cameras, is toward smaller, tightly packed devices. It is usually difficult, if not impossible, to remotely locate and thereby isolate a memory eject interface, as could be done, e.g., in a computer system. Instead the memory device interface lies well within the camera and closely adjacent to camera electronics. Thus it is especially important to isolate the memory device from transmissions and signals that might be generated by circuitry in the camera.

A typical peripheral device is a memory card, such as a hard drive card. Sometimes, the top and bottom covers of the card are formed of conductive material such as stainless steel to provide good EMI shielding. However, PC card peripherals are often not provided with good shielding along the perimeter of the card, that is, the outside of the device between the top and bottom covers. In U.S. Pat. No. 5,333,100 a data card is provided with an electrically conductive rail extending along its opposite sides and part of its rear, and connected to the ground plane of a circuit board on the card, to provide EMI shielding along the perimeter of the card.

In addition, a PC card peripheral is ordinarily attached to digital electronics through an eject interface in the electronic device, which includes an opening in its product enclosure so that the peripheral can be inserted into the device. This opening results in a "hot" area of EMI susceptibility, as well as a small "dead air" region between the sides of the peripheral and the enclosure that can act as an EMI radiator. Moreover, some digital devices, such as a digital camera, are meant to be operable through direct connection to a host computer without use of a PC card peripheral, i.e., without a card inserted into the eject interface. In both cases, EMI can emanate from the unobstructed areas of the opening into the environment, and cause undesirable interference with other devices.

The problem with the current card-based approach is that the camera manufacturer, as well as the camera user, is forced to rely upon the peripheral device (vs. the eject mechanism) for EMI protection. Particularly in the case of tightly packed electronics in a modern digital camera, the performance of the camera may suffer unless EMI protection can be designed into the camera in a fail-safe manner.

SUMMARY OF THE INVENTION

The present invention is directed to overcoming one or more of the problems set forth above. Briefly summarized, according to one aspect of the present invention, an eject interface for a removable peripheral used in an electronic device includes an eject mechanism for removably receiving the peripheral, a shield for enclosing at least part of the eject mechanism in order to isolate the peripheral from EMI generated by the device, and a grounding connection on the shield for grounding the shield to a circuit ground on the device.

The advantage of the invention is that the shielding allows for the placement of the eject mechanism within the high speed electronics of, e.g., a digital camera. The result is a compact, integral system versus having to remotely locate the eject mechanism.

These and other aspects, objects, features and advantages of the present invention will be more clearly understood and appreciated from a review of the following detailed description of the preferred embodiments and appended claims, and by reference to the accompanying drawings.

DETAILED DESCRIPTION OF THE INVENTION

Because imaging devices employing electronic sensors are well known, as are removable peripheral devices such as memory cards, the present description will be directed in particular to elements forming part of, or cooperating more directly with, apparatus in accordance with the present invention. Elements not specifically shown or described herein may be selected from those known in the art.

Figure 1:
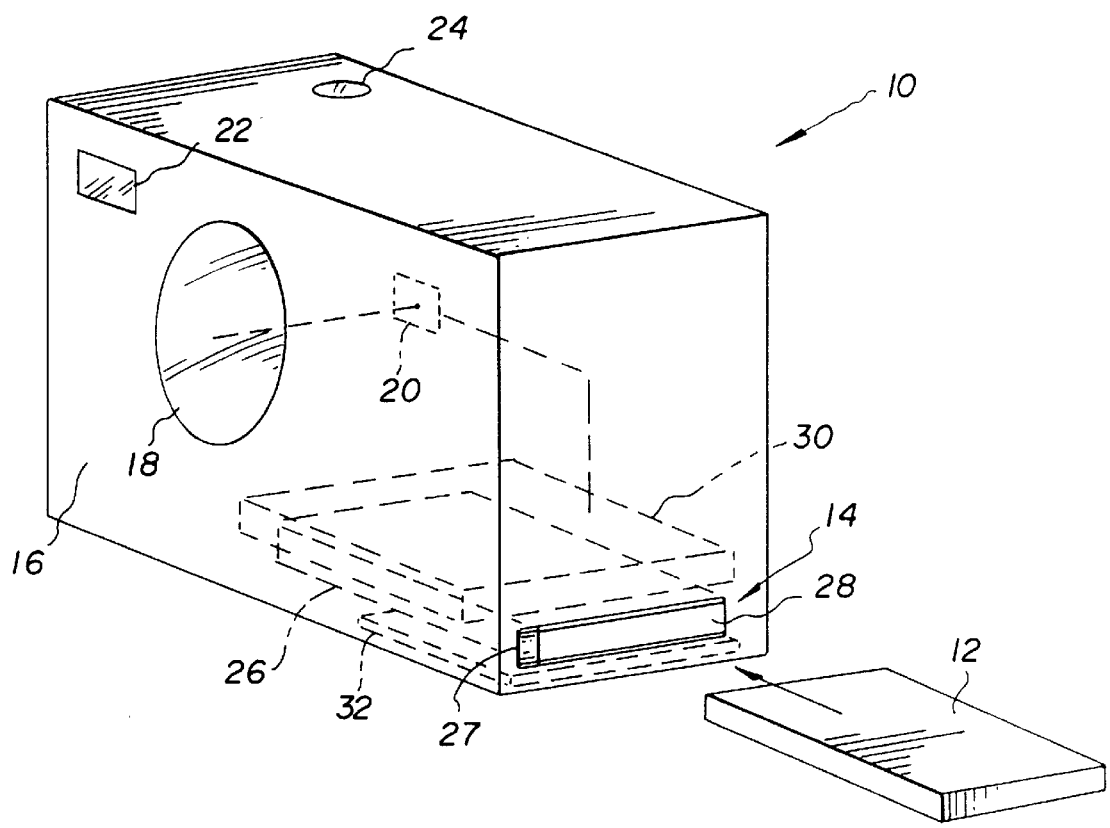
FIG. 1 is a perspective view of an electronic camera having an eject interface according to the invention.

FIG. 1 illustrates a camera 10 that is adapted for use with a peripheral device 12 capable of insertion into an eject interface 14 according to the invention. The camera includes a case 16 on which a lens 18 is mounted in optical relation to an image sensor 20. An optical viewfinder 22 is used to frame the image relative to the image sensor 20 prior to capture. The image sensor 20 is driven to capture an image when a user actuates a shutter release 24. The eject interface 14 includes an eject mechanism 26, one or more eject buttons 27, and an opening 28. The eject mechanism 26 and the opening 28 are shielded according to the invention against electromagnetic interference (EMI) from the electronics in the camera, thereby shielding the peripheral device 12 from EMI and preventing the emanation and radiation of EMI from the opening 28 into the environment. More specifically, the camera 10 includes electronics components 30,32 that are capable of EMI emissions, and which are shown situated in close proximity to the eject mechanism 26. The opening 28 may include a door (not shown), which is intended to prevent the entry of dirt and dust, rather than the emanation of EMI. While not particularly illustrated in FIG. 1, it is often the case that the camera 10 is very small in size and the electronics components 30,32 are necessarily, for lack of space, close to the eject mechanism 26.

In operation, the peripheral device 12 is inserted through the opening 28 into the eject mechanism 26 in order to establish connection with the electronic components 30,32. The peripheral device may take several conventional forms. For example, the peripheral device 12 may be a conventional memory card, either a solid state memory card or a hard drive memory card, that connects to the internal electronic components 30,32 in order to save the captured images. An example would be a memory card meeting the PCMCIA interface standard. The peripheral device 12 may also be a conventional modem card that includes external connections for connecting the camera 10 into an external network, or a conventional video card with onboard video processing and an external connection for connecting the camera 10 to a video display. As the aforementioned examples of types of peripheral devices are not intended to be exhaustive, the invention may be used with other types of peripherals not described herein. When use of the respective peripheral device 12 is completed, the appropriate eject button 27 is pressed and an eject linkage (not shown) within the eject mechanism 26 pushes the device 12 outward through the opening 28, where it may be grasped by the user and removed from the camera 10.

Figure 2:
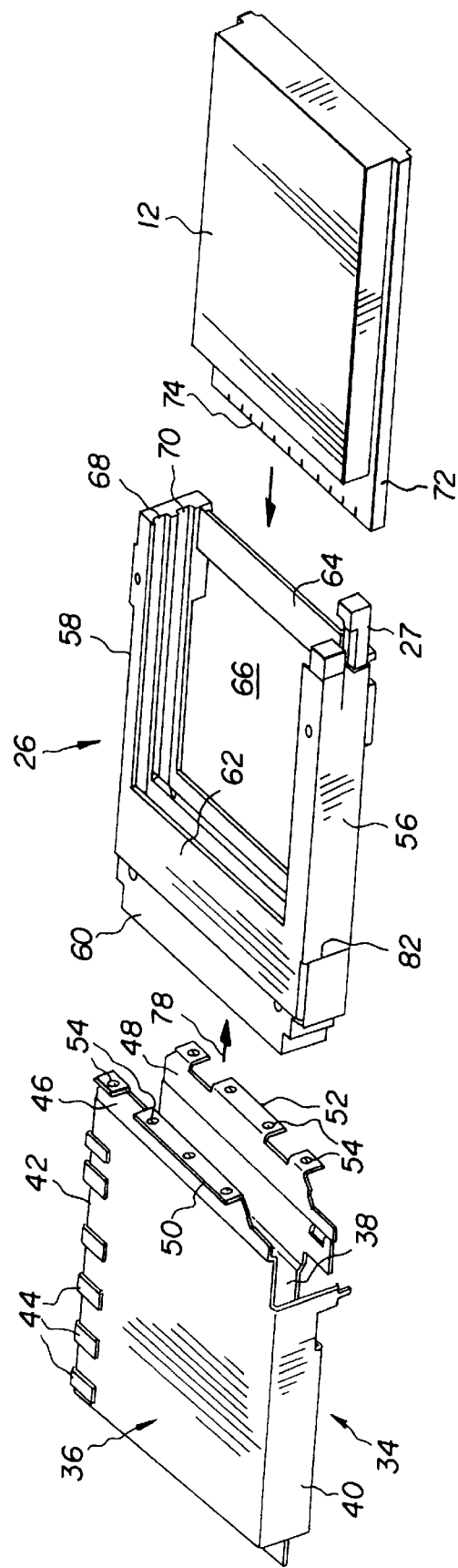
FIG. 2 is an exploded view of the eject mechanism according to the invention.
Figure 3:
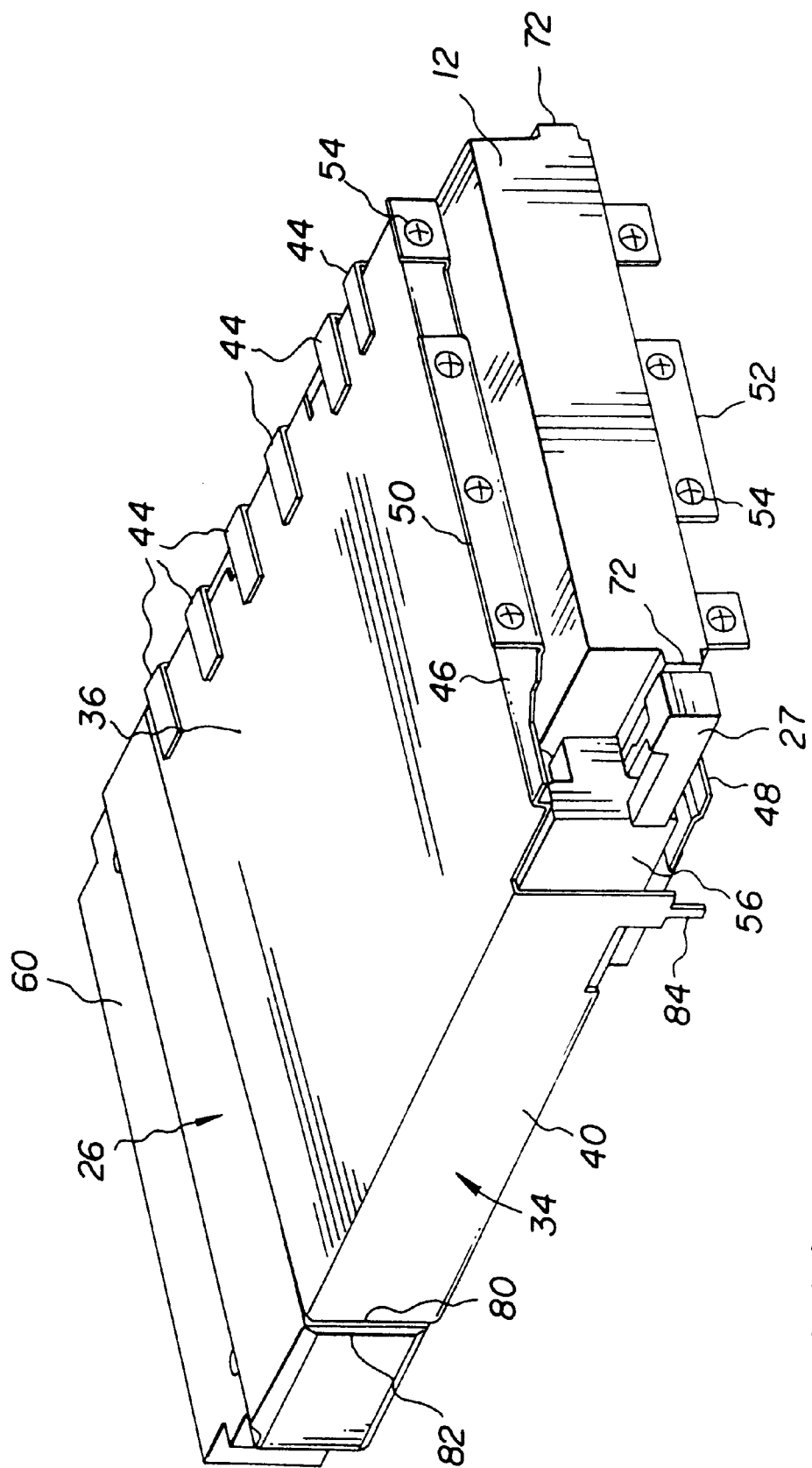
FIG. 3 is an assembled view of the eject mechanism shown in FIG. 2.
Figure 4:
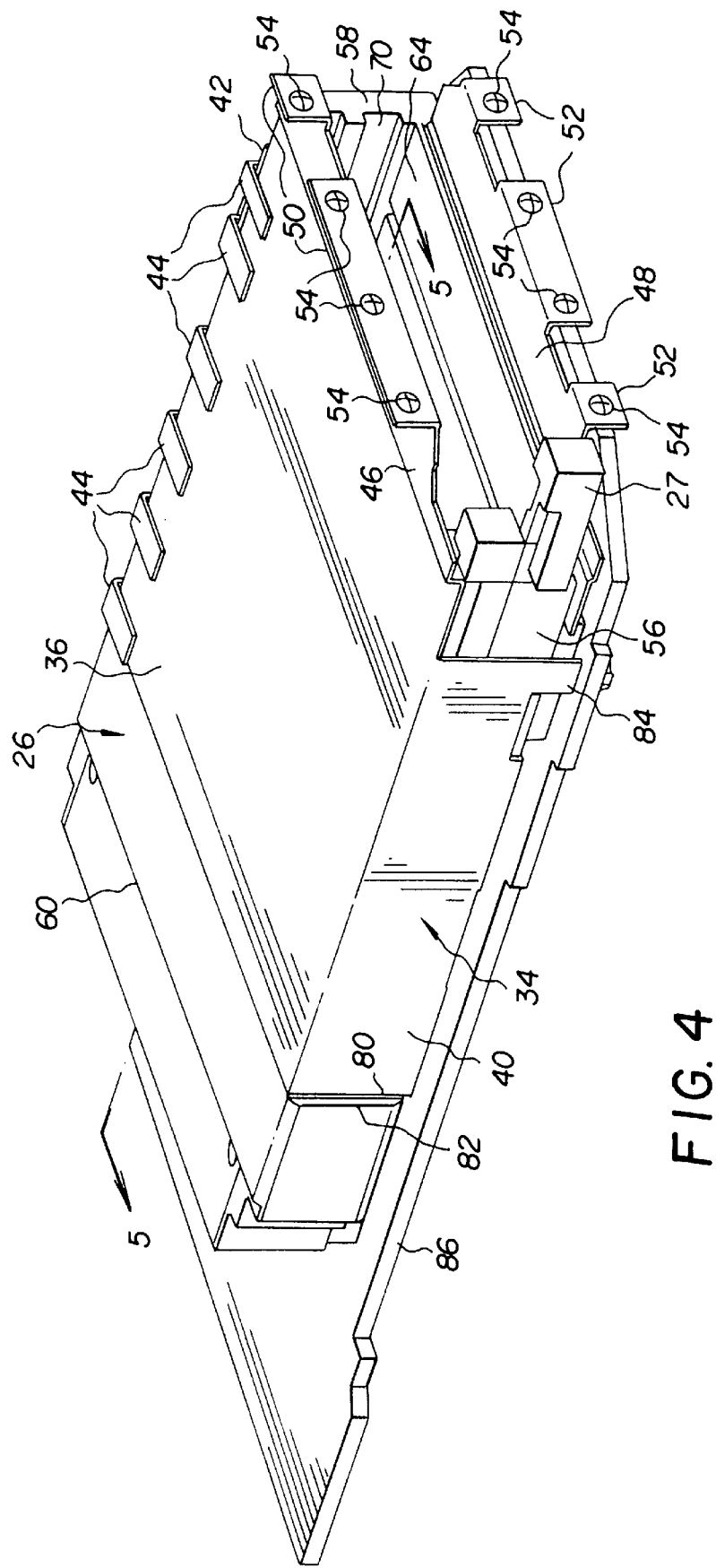
FIG. 4 is a view of the eject mechanism shown in FIG. 3 attached to a circuit board.

As shown in FIG. 2, 3 and 4, the eject interface 14 includes the eject mechanism 26 and an EMI shield 34. Formed of a conductive material, e.g., aluminum or steel sheet metal, the shield 34 includes top and bottom panels 36,38 and side panels 40,42. Though the shield 34 may be fabricated in different conventional ways, it is shown in FIG. 2 as an integral piece of sheet metal folded over to form an enclosure for the eject mechanism 26. A plurality of tabs 44 are provided on the side panel 42 so as to fold over the top panel 36 and to provide a solder connection surface to the top panel 36. While the panels 36,38,40,42 are shown to be solid, it is possible to cut away portions of the panels, particularly the side panels 40,42, to provide, e.g., clearance for linkage components (not shown) in the eject mechanism 26. In terms of EMI isolation, it is best to keep the top and bottom panels 36,38 as solid as possible. The EMI shield 36 further includes raised frontal portions 46,48 on the front edges of the top and bottom panels 36,38, which terminate in respective upturned flanges 50,52 each with a plurality of raised bumps 54 pressed into the flange.

Figure 5:
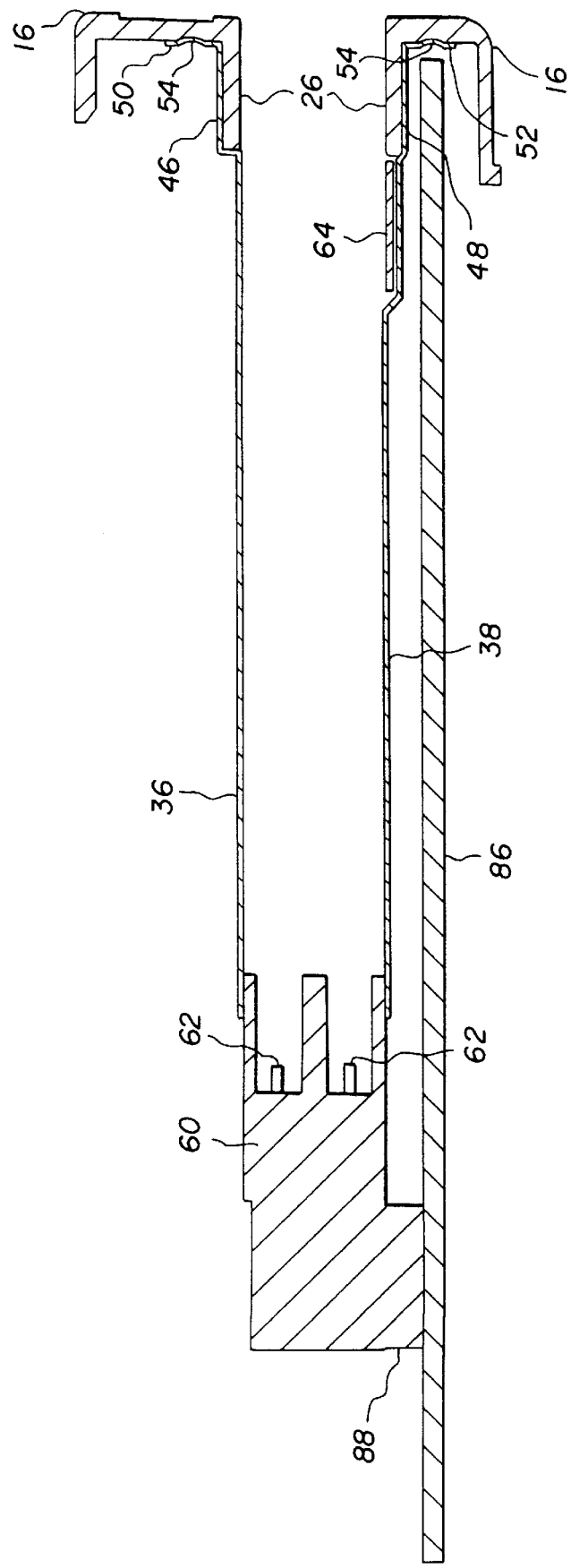
FIG. 5 is a section of the eject mechanism shown in FIG. 4 as taken along line 5—5, further showing attachment to the camera case.

The eject mechanism 26 is a conventional design including side walls 56,58 separated at the rear by a connector assembly 60 having a plurality of connector pins 62 (shown in FIG. 5) and at the front by a spacer 64. As is typical of such a device, there is a large open, unshielded central section 66 that allows EMI emissions emanating from the camera electronics to reach the peripheral device 12, and thereby escape from the opening 28 into the environment, when it is inserted into the eject mechanism 26 (as shown in FIG. 3). The eject mechanism 26 includes keyways 68,70 for two thin peripheral devices or for one wider peripheral device, e.g., two thin solid state memory cards or for one wider hard drive card, such as the device 12 shown in FIG. 2. The peripheral device 12 includes a complementary key 72 which mates with a respective keyway 70. When the peripheral device 12 is inserted into the eject mechanism 26, a set of connector holes 74 in the device 12 mate with the connector pins 62, and the peripheral device 12 is thereby connected into the circuits 30,32 shown in FIG. 1. The eject button 27 is connected to a conventional eject linkage (not shown), which forces the peripheral device 12 out of the eject mechanism 26 when the button 27 is pressed.

When the EMI shield 34 is slid over the eject mechanism 26 according to an arrow 78 shown in FIG. 2, the assembled structure of FIG. 3 is obtained. In particular, an edge 80 on the EMI shield 34 is seated against a ledge 82 on the eject mechanism 26 such that the frontal portions 46,48 extend forward of the eject mechanism 26. The EMI shield 36 of the assembled structure is connected to a camera system ground in order to at least partially isolate the eject interface 14 from EMI emissions. Although one good connection is sufficient, the EMI shield 36 is grounded both to a circuit board and to the camera case 16, which has a grounded conductive coating formed on its inner wall. (Such conductive coatings are well known and conventionally applied to electronic enclosures.) As especially shown in FIG. 5, a portion of the camera case 16 rides under the frontal portions 46,48 and the flanges 50,52 contact the inner wall of the case 16. Each bump 54 is inset into the case 16 such that conductive contact is made between the metallic shield 36 and the conductive coating on the inside wall of the case 16. The flanges 50,52 are positioned against the inner wall of the case 16 and angled obliquely, i.e. greater than 90°, with respect to the top and bottom panels 36,38 such that an interference fit is established between the bumps 54 and the inner wall of the case 16. The eject mechanism is further held in place by a connection 88 with a circuit board 86. As shown in FIG. 4, the EMI shield 34 further includes a spade 84 that connects into the ground plane of the printed circuit board 86. This design also allows for operation of the camera without a peripheral device 12 present, that is, with the opening 28 unobstructed and open, without risk of EMI influencing operation of other devices in the environment.

The invention has been described with reference to a preferred embodiment. However, it will be appreciated that variations and modifications can be effected by a person of ordinary skill in the art without departing from the scope of the invention. It is to be understood that this invention can be used with any kind of electronic device, particularly high speed digital devices such as cameras, scanners, and printers.

PARTS LIST 10 camera
12 memory card
14 eject interface
16 case
18 lens
20 image sensor 20
22 optical viewfinder
24 shutter release
26 eject mechanism
27 eject button
28 opening
30 electronic component
32 electronic component
34 shield
36 top panel
38 bottom panel
40 side panel
42 side panel
44 tabs
46 frontal portion
48 frontal portion
50 flange
52 flange
54 bump
56 side wall
58 side wall
60 connector assembly
62 connector pins
64 spacer
66 open central section 68 keyway
70 keyway
72 key
74 connector holes
76 eject lever
78 arrow
80 edge
82 ledge
84 spade
86 printed circuit board
88 connection

What is claimed is:

1. An eject interface for a removable active peripheral used in an electronic device, said device having electronic circuits capable of generating electromagnetic interference (EMI), said eject interface comprising:

an eject mechanism for removably receiving the active peripheral;

a shield for enclosing at least part of the eject mechanism in order to at least partially isolate the peripheral from EMI generated by the electronic circuits in the device, the shield comprising a top portion immediately adjacent a top region of the eject mechanism, a bottom portion immediately adjacent a bottom region of the eject mechanism, and at least one of a first side portion and a second side portion, the first side portion immediately adjacent a first side region of the eject mechanism, the second side portion immediately adjacent a second side region of the eject mechanism; and a grounding connection on the shield for grounding the shield to a circuit ground in the device.

2. An eject interface as claimed in claim 1 wherein the eject mechanism has one or more open areas exposing the peripheral to the electronic circuits in the device, and wherein the shield covers at least the open areas.

3. An eject interface as claimed in claim 1 wherein the device includes an enclosure and the eject mechanism is mounted within the enclosure such that the shield contacts an inner wall surface of the enclosure.

4. An eject interface as claimed in claim 3 wherein the inner wall is conductive and connected to the circuit ground, and the grounding connection connects the shield to the inner wall surface.

5. An eject interface as claimed in claim 4 wherein the grounding connection includes one or more protruding bumps on the shield that contact the inner wall surface.

6. An eject interface as claimed in claim 1 wherein the device includes a circuit board with processing electronics, and the grounding connection is a metal connection between the shield and a ground plane of the circuit board.

7. An eject interface as claimed in claim 1 wherein the peripheral is a memory card.

8. An eject interface as claimed in claim 7 wherein the memory card is a hard drive card.

9. An eject interface as claimed in claim 1 wherein the peripheral is a modem card.

10. An eject interface as claimed in claim 1 wherein the peripheral is a video card.

11. An eject interface for a removable active memory card used in an electronic camera, said camera having electronic circuits capable of generating electromagnetic interference (EMI), said eject interface comprising:

an eject mechanism for removably receiving the active memory card;

a shield for enclosing at least part of the eject mechanism in order to at least partially isolate the interface from EMI generated by the electronic circuits in the camera, the shield having a top portion immediately adjacent a top region of the eject mechanism, a bottom portion immediately adjacent a bottom region of the eject mechanism, and at least one of a first side portion and a second side portion, the first side portion immediately adjacent a first side region of the eject mechanism, the second side portion immediately adjacent a second side region of the eject mechanism; and a grounding connection on the shield for grounding the shield to a circuit ground in the camera.

12. An eject interface as claimed in claim 11 wherein the eject mechanism has one or more open areas exposing the memory card to the electronic circuits in the camera and the shield covers at least the open areas.

13. An eject interface as claimed in claim 11 wherein the camera includes a camera enclosure and the eject mechanism is mounted within the camera enclosure such that the shield contacts an inner wall surface of the camera enclosure.

14. An eject interface as claimed in claim 13 wherein the inner wall is conductive and connected to the circuit ground, and the grounding connection connects the shield to the inner wall surface.

15. An eject interface as claimed in claim 14 wherein the grounding connection is one or more protruding bumps on the shield that contact the inner wall surface.

16. An eject interface as claimed in claim 11 wherein the camera includes a circuit board with processing electronics, and the grounding connection is a metal connection between the shield and a ground plane of the circuit board.

17. An eject interface as claimed in claim 11 wherein the removable memory card is a hard drive card.

18. An electronic camera protected against electromagnetic interference (EMI) between camera circuits and a removable active peripheral device, said electronic camera comprising:

a camera enclosure including circuit components therewithin connected to a circuit ground;

an eject mechanism mounted within the camera enclosure for receiving the removable active peripheral device, said eject mechanism having at least top and bottom regions exposed to EMI from the circuit components;

an EMI shield closely adjacent with a substantial portion of at least the top and bottom regions of the eject mechanism to at least partially isolate the peripheral device from EMI generated by the circuit components, the EMI shield comprising at least a top portion immediately adjacent the top region of the eject mechanism, a bottom portion immediately adjacent the bottom region of the eject mechanism, and at least one of a first side portion and a second side portion each immediately adjacent a corresponding side region of the eject mechanism; and a grounding connection on the shield for grounding the shield surfaces to the circuit ground.

19. The eject interface of claim 1 wherein two or more of the portions of the shield are formed integrally of a single piece of conductive material.

20. The eject interface of claim 1 wherein at least one of the first and second side portions of the shield includes an extended spade region integral therewith and adapted for connection to a circuit board of the device.

* * * * *